(12) United States Patent
Takematsu et al.

(10) Patent No.: US 10,613,135 B2
(45) Date of Patent: Apr. 7, 2020

(54) SEMICONDUCTOR DEVICE

(71) Applicant: Fuji Electric Co., Ltd., Kanagawa (JP)

(72) Inventors: Yuji Takematsu, Tokyo (JP); Kenji Okamoto, Tokyo (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/368,778

(22) Filed: Mar. 28, 2019

(65) Prior Publication Data

US 2019/0227115 A1 Jul. 25, 2019

Related U.S. Application Data

(62) Division of application No. 14/820,298, filed on Aug. 6, 2015, now abandoned.

(30) Foreign Application Priority Data

Aug. 29, 2014 (JP) .................. 2014-175755

(51) Int. Cl.
*G01R 31/28* (2006.01)
*H01L 23/29* (2006.01)
(Continued)

(52) U.S. Cl.
CPC ..... *G01R 31/2875* (2013.01); *G01R 31/2851* (2013.01); *G01R 31/2896* (2013.01);
(Continued)

(58) Field of Classification Search
None
See application file for complete search history.

(56) References Cited

U.S. PATENT DOCUMENTS 6,296,911 B1 10/2001 Catarineu Guillen
7,553,355 B2 6/2009 Torres, Jr. et al.
(Continued)

FOREIGN PATENT DOCUMENTS

JP   S61-59242 A   3/1986
JP   H05-99978 A   4/1993
(Continued)

OTHER PUBLICATIONS

Japanese Office Action dated Jan. 23, 2018, in a counterpart Japanese patent application No. 2014-175755. (Cited in the parent U.S. Appl. No. 14/820,298 and a machine translation (not reviewed for accuracy) attached.).
(Continued)

*Primary Examiner* — David E Graybill
(74) *Attorney, Agent, or Firm* — Chen Yoshimura LLP

(57) ABSTRACT

A semiconductor device including: an insulating substrate; a semiconductor element mounted on the insulating substrate; an internal printed circuit board disposed on the semiconductor element; and a sealing member that seals the semiconductor element, the internal printed circuit board, and at least a portion of the insulating substrate. The sealing member is made of a sealant that includes a resin and a pigment, and that initially has a chromatic, white, or gray color, and the sealing member degrades, thereby causing color of a front surface thereof to change to a degree recognizable by a user after the semiconductor device has been in use under a prescribed condition for a prescribed duration.

6 Claims, 3 Drawing Sheets

(51) Int. Cl.
*H01L 23/31* (2006.01)
*H01L 23/00* (2006.01)

(52) U.S. Cl.
CPC .......... *H01L 23/29* (2013.01); *H01L 23/3121* (2013.01); *H01L 24/01* (2013.01); *G01R 31/2856* (2013.01); *H01L 2224/32225* (2013.01); *H01L 2924/181* (2013.01)

(56) References Cited

U.S. PATENT DOCUMENTS

| | | | |
|---|---|---|---|
| 7,947,111 | B2 | 5/2011 | Torres, Jr. et al. |
| 8,137,438 | B2 | 3/2012 | Torres, Jr. et al. |
| 8,450,845 | B2 | 5/2013 | Ikeda et al. |
| 8,673,691 | B2 | 3/2014 | Ikeda et al. |
| 8,907,477 | B2 | 12/2014 | Yamada et al. |
| 9,379,083 | B2 | 6/2016 | Iizuka et al. |
| 9,418,916 | B2 | 8/2016 | Nakamura et al. |
| 9,504,154 | B2 | 11/2016 | Tada et al. |
| 9,528,004 | B2 | 12/2016 | Ribi |
| 9,615,619 | B2 | 4/2017 | Folkesson |
| 9,648,732 | B2 | 5/2017 | Nakamura et al. |
| 9,854,708 | B2 | 12/2017 | Yamada et al. |
| 2005/0186123 | A1 | 8/2005 | Torres, Jr. et al. |
| 2006/0063883 | A1 | 3/2006 | Folkesson |
| 2009/0278455 | A1 | 11/2009 | Torres, Jr. et al. |
| 2011/0037166 | A1 | 2/2011 | Ikeda et al. |
| 2011/0049766 | A1 | 3/2011 | Del Mundo et al. |
| 2011/0127660 | A1 | 6/2011 | Torres, Jr. et al. |
| 2012/0241953 | A1 | 9/2012 | Yamada et al. |
| 2013/0267064 | A1 | 10/2013 | Ikeda et al. |
| 2014/0055973 | A1 | 2/2014 | Hirai |
| 2014/0275381 | A1 | 9/2014 | Ribi |
| 2014/0347836 | A1 | 11/2014 | Nakamura et al. |
| 2014/0355219 | A1 | 12/2014 | Tada |
| 2014/0367736 | A1 | 12/2014 | Iizuka et al. |
| 2015/0109738 | A1 | 4/2015 | Yamada et al. |
| 2015/0179551 | A1 | 6/2015 | Nakamura et al. |
| 2015/0271922 | A1 | 9/2015 | Kawabata et al. |
| 2015/0380335 | A1 | 12/2015 | Takematsu et al. |
| 2016/0061885 | A1 | 3/2016 | Takematsu et al. |

FOREIGN PATENT DOCUMENTS

| | | |
|---|---|---|
| JP | 2004-236465 A | 8/2004 |
| JP | 2007-134361 A | 5/2007 |
| JP | 2008-258429 A | 10/2008 |
| JP | 2012-190897 A | 10/2012 |
| JP | 2012-202695 A | 10/2012 |
| JP | 2014-114426 A | 6/2014 |
| JP | 2014-224824 A | 12/2014 |
| JP | 2016-051781 A | 4/2016 |
| WO | 2011/083737 A1 | 7/2011 |
| WO | 2017/002728 A1 | 1/2017 |

OTHER PUBLICATIONS

NPL: Basic of Latest Semiconductor Device Package, Transistor Technology, published in Jul. 2004. A concise explnation of relevance provided in an Amendment filed concurrently hefrewith.

SEMICONDUCTOR DEVICE

BACKGROUND OF THE INVENTION

Technical Field

The present invention relates to a semiconductor device.

Background Art

Patent Document 1 discloses, in relation to a power module, a semiconductor device that includes a base plate. According to the same document, the service life of a semiconductor device, which is determined by the progression of solder embrittlement, can be predicted by observing changes in the appearance of the semiconductor device that are a result of cracks in the base plate.

RELATED DOCUMENT

Patent Document

Patent Document 1: Japanese Patent Application Laid-Open Publication No. 2012-190897

SUMMARY OF THE INVENTION

Accordingly, the present invention is directed to a semiconductor device and method that substantially obviate one or more of the problems due to limitations and disadvantages of the related art.

An object of the present invention is to provide a relatively simple and effective way and structure to evaluate the degree of usage and/or remaining life span of a semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device including: an insulating substrate; a semiconductor element mounted on the insulating substrate; an internal printed circuit board disposed on the semiconductor element; and a sealing member that seals the semiconductor element, the internal printed circuit board, and at least a portion of the insulating substrate; wherein the sealing member is made of a sealant that includes a resin and a pigment, and that initially has a chromatic, white, or gray color, and wherein the sealing member degrades, thereby causing color of a front surface thereof to change to a degree recognizable by a user after the semiconductor device has been in use under a prescribed condition for a prescribed duration.

It is preferable that the pigment have a blue color so that a $b^*$ value within a $L^*a^*b^*$ color space of the front surface of the sealing member is $-40$ to $-20$.

It is preferable that the $b^*$ value of at least a portion of the front surface of the sealing member change to $-5$ or above as a result of degradation of the sealant.

It is preferable that the pigment have a blue color and the sealant further include another pigment that has a yellow color, so that an $a^*$ value within a $L^*a^*b^*$ color space of the front surface of the sealing member is $-30$ to $-15$.

It is preferable that the $a^*$ value of at least a portion of the front surface of the sealing member change to $-5$ or above as a result of degradation of the sealant.

According to a different embodiment, a device including a printed circuit board, and the semiconductor device mounted in a plurality on the printed circuit board, is provided.

In another aspect, the present disclosure provides a method of estimating remaining life of a semiconductor device that includes a sealing member made of a sealant, the sealant initially having a chromatic, white, or gray color, the method including: heating a test sealant that has the same composition as the sealant in the semiconductor device at prescribed heating temperatures for prescribed durations; acquiring a relationship among the heating temperatures, heating durations, and resulting changes in color of the test sealant, by observing the color of the test sealant while the test sealant is being heated; and estimating the remaining life of the semiconductor device that has been operated, by evaluating color of a front surface of the sealing member in accordance with the relationship acquired in the step of acquiring the relationship.

The color of the test sealant may be quantified in the step of acquiring the relationship.

The color of the test sealant may be quantified using a $L^*a^*b^*$ color space in the step of acquiring the relationship.

In another aspect, the present disclosure provides a method of verifying the quality of semiconductor devices, including: mounting a plurality of semiconductor devices, each including a sealing member formed of a sealant that initially has a chromatic, white, or gray color, on a substrate; comparing degrees of discoloration of the respective sealing members in the plurality of semiconductor devices to one another; and determining that the plurality of semiconductor devices are in good working condition when the step of comparing does not show a prescribed degree of variation in the degrees of discoloration among the plurality of semiconductor devices, and determining that the plurality of semiconductor devices are not in good working condition when the step of comparing shows the prescribed degree of variation in the degrees of discoloration among the plurality of semiconductor devices.

According to one aspect of the present invention, the degree of degradation of a sealant forming a sealing member that seals a semiconductor element can be determined from the appearance of the sealing member.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described hereafter with reference to the drawings. However, the present invention is not limited to the embodiments described below. Furthermore, in this specification, the terms "top" and "bottom" are relative terms used for descriptive purposes to indicate "top" and "bottom" within the drawings, and are not terms that indicate "top" and "bottom" within the actual embodiments of the semiconductor device.

Embodiment 1

Figure 1:
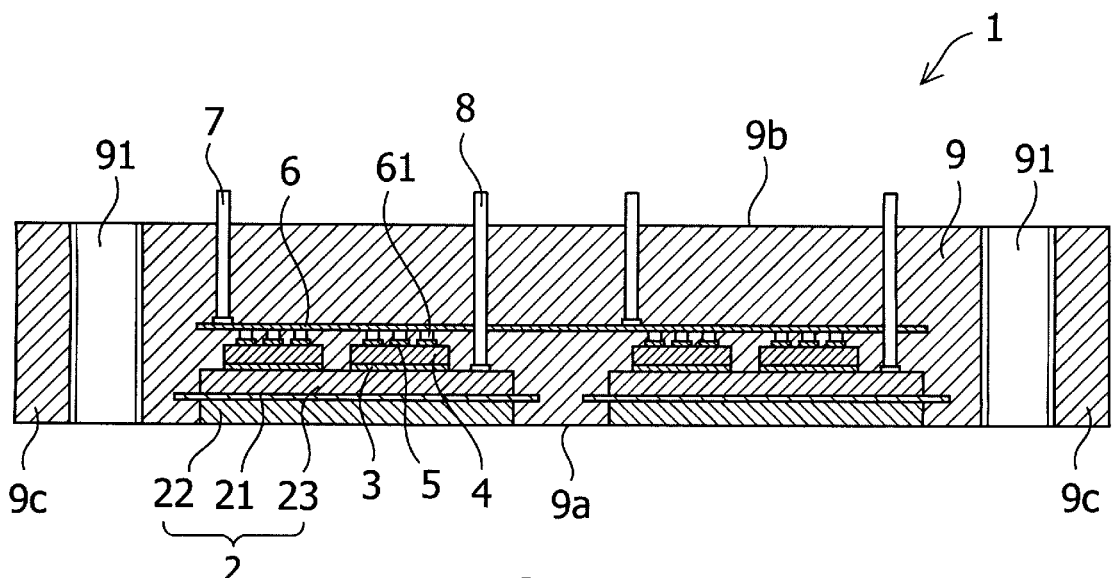
FIG. 1 is an explanatory diagram that illustrates a cross-sectional structure of a semiconductor device.

As shown in FIG. 1, a semiconductor device 1 includes an insulating substrate 2. The insulating substrate 2 includes an insulating layer 21, a first copper plating 22 attached to the bottom of the insulating layer 21 so as to be parallel to the insulating layer 21, and a second copper plating 23 attached to the top of the insulating layer 21 so as to be parallel to the insulating layer 21.

The semiconductor device 1 includes a plate-like SiC (silicon carbide) semiconductor element 4. This SiC semiconductor element 4 is mounted on the top of the second copper plating 23 that forms a portion of the insulating substrate 2 via a first connecting layer 3 that is electrically conductive, with the SiC semiconductor element 4 being mounted so as to be parallel to the insulating substrate 2. An implanted printed circuit board 6 that is an internal printed circuit board in the semiconductor device 1 is attached to the top of the SiC semiconductor element 4 via a second connecting layer 5 that is electrically conductive. The implanted printed circuit board 6 includes implant pins 61 on the bottom, and is attached to the second connecting layer 5 via these implant pins 61.

The semiconductor device 1 further includes a terminal 7 attached to the top of the implanted printed circuit board 6, and a terminal 8 attached to the top of the second copper plating 23. The semiconductor device 1 can electrically connect to the exterior of the semiconductor device 1 via the terminals 7 and 8.

The semiconductor device 1 further includes a sealing member 9 that seals the SiC semiconductor element 4, the implanted printed circuit board 6, and at least a portion of the insulating substrate 2. The sealing member 9 is formed so that the semiconductor device 1 will have a substantially cuboid shape as a whole. The bottom of the first copper plating 22 that forms a portion of the insulating substrate 2 is exposed to the exterior of the semiconductor device 1 at the back surface 9a of the sealing member 9. The tip portions of the terminals 7 and 8 protrude to the outside of the semiconductor device 1 from a front surface 9b of the sealing member 9.

A substantially cylindrical mounting clamp 91 is embedded in the periphery 9c of the sealing member 9. A bolt (not shown) for attaching the semiconductor device 1 upon another member, with the back surface 9a functioning as the attachment surface, is inserted in the mounting clamp 91.

The sealing member 9 is formed of a sealant made by adding a pigment and a curing agent to an epoxy resin, which is the primary component. A single pigment or a combination of a plurality of pigments can be used so that the sealant is a color other than black, such as a chromatic, white, or gray color.

When the semiconductor device 1 is operated, the sealant that forms the sealing member 9 degrades as a result of heat. As this degradation occurs, the color of at least the front surface 9b of the sealing member 9, which was originally chromatic, white, or gray, fades and changes to black over time. Specifically, the closer a portion of the front surface 9b is to the SiC semiconductor element 4, the more discoloration occurs as a result of heat generated by the SiC semiconductor element 4. In such cases, partial discoloration is observed on the front surface 9b. On the other hand, the entire front surface 9b discolors uniformly as a result of heat from outside the semiconductor device 1.

According to the semiconductor device 1 as described above, the degree of degradation of the sealant that forms the sealing member 9 can be determined by observing the front surface 9b of the sealing member 9. The degree to which the sealant has degraded can be determined by how black the color of the front surface 9b has become. In addition, it can be determined that the sealing member 9 has degraded as a result of heat generated by the SiC semiconductor element 4 if the discoloration is not uniform. Conversely, it can be determined that the sealing member 9 has degraded as a result of heat from outside the semiconductor device 1 if the discoloration is nearly uniform across the entire front surface 9b of the sealing member 9.

Furthermore, as a result of preparing a first semiconductor device and a second semiconductor device that have the same structure as the semiconductor device 1 and then conducting heat degradation tests on the first semiconductor device, the remaining life of the second semiconductor device at a certain time can be estimated when actually placed and operated in a power conditioner or the like. This process is described in more detail below.

Step 1: Heat degradation tests are conducted on the first semiconductor device and a relationship between a value that represents the color of the front surface 9b of the sealing member 9 of the first semiconductor device and the operating time of the first semiconductor device is obtained.

Step 2: The second semiconductor is actually used, and the color of the front surface of the sealing member 9 of the second semiconductor device at a certain time is quantified. This quantification can be done using a colorimeter, for example.

Step 3: The remaining life of the second semiconductor device is estimated by comparing the value representing the color of the front surface 9b of the sealing member 9 of the second semiconductor device to the relationship obtained from the heat degradation tests.

Example 1

In this example, a sealing member 9 of a first semiconductor device and a sealing member 9 of a second semiconductor device are formed of a sealant that includes a singular pigment of copper phthalocyanine, which is blue. This means that the sealing members 9 will also be blue.

A L*a*b* color space, which is one type of color space, is used to quantify this blue color. This L*a*b* color space was established by the International Committee on Illumination (CIE) and has been adopted by the Japan Industrial Standards (JIS). When looking only at negative values, a b* value in the L*a*b* color space indicates that the blue becomes brighter as the value becomes smaller, and fades as the value approaches 0. The initial b* value of a front surface 9b of the sealing member 9 is −40 to −20.

Figure 2:
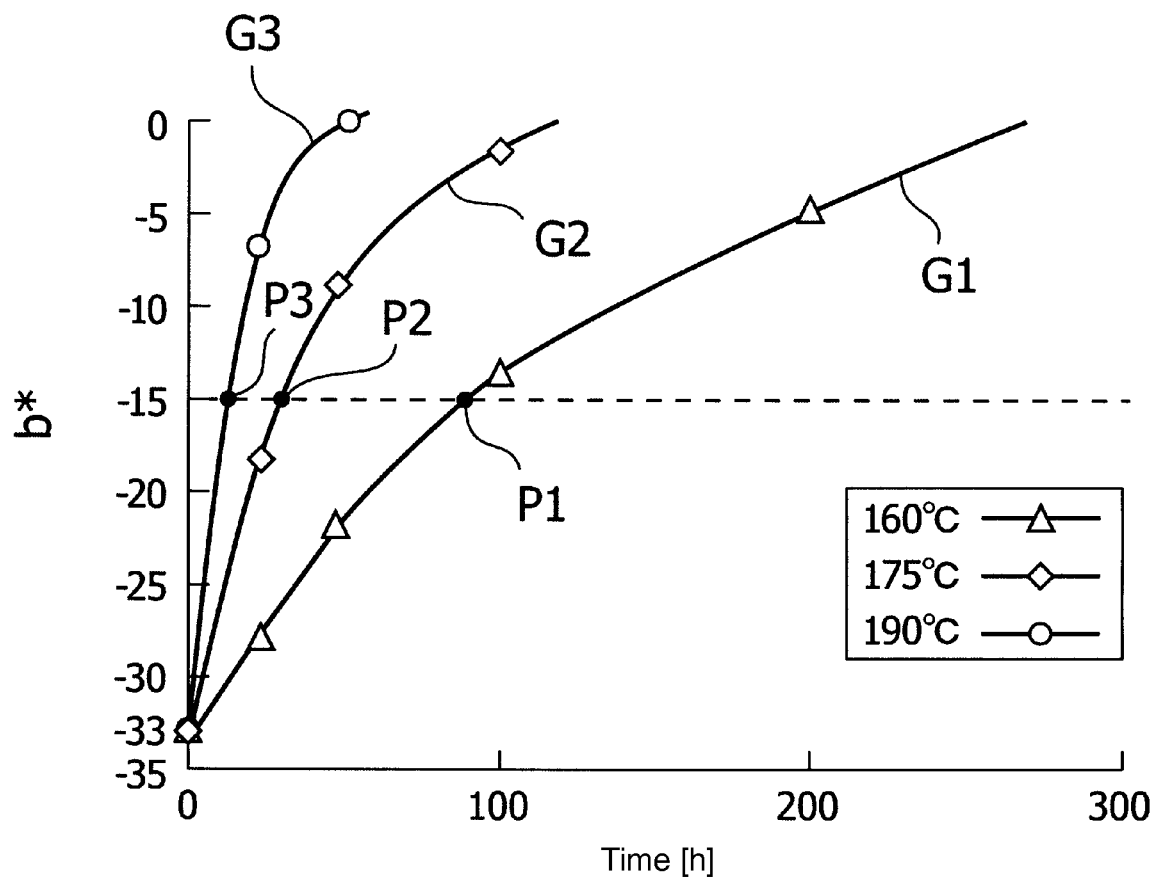
FIG. 2 is an explanatory diagram that illustrates a relationship between an operating time of the semiconductor device and a value $b^*$.

The results of heat degradation tests conducted on a first semiconductor device that includes such a sealing member 9 are shown in FIG. 2. FIG. 2 also illustrates a relationship between an operating time of the first semiconductor device 1 and the value of b*. As shown in the figure, the initial b* value of the front surface 9b of the sealing member 9 is −33. The value of b* after the start of heat degradation tests represents the value of the portion of the front surface 9b of the sealing member 9 in which the most discoloration occurred.

Curve G1 in FIG. 2 illustrates the results of a semiconductor device being continuously operated so that the temperature of a front surface 9b reaches 160° C. In addition, curve G2 illustrates the results of a semiconductor device being continuously operated so that the temperature of a front surface 9b reaches 175° C. Curve G3 illustrates the results of a semiconductor device being continuously operated so that the temperature of a front surface 9b reaches 190° C.

As shown in curves G1 to G3, the value of b* increases over time from the initial value of −33 to a value of −5 or higher. In addition, the rate at which the value of b* increases rises as the temperature of the front surface 9b becomes hotter. The points at which the value of b* became −15 are represented by points P1 to P3 respectively on curves G1 to G3 in FIG. 2.

Figure 3:
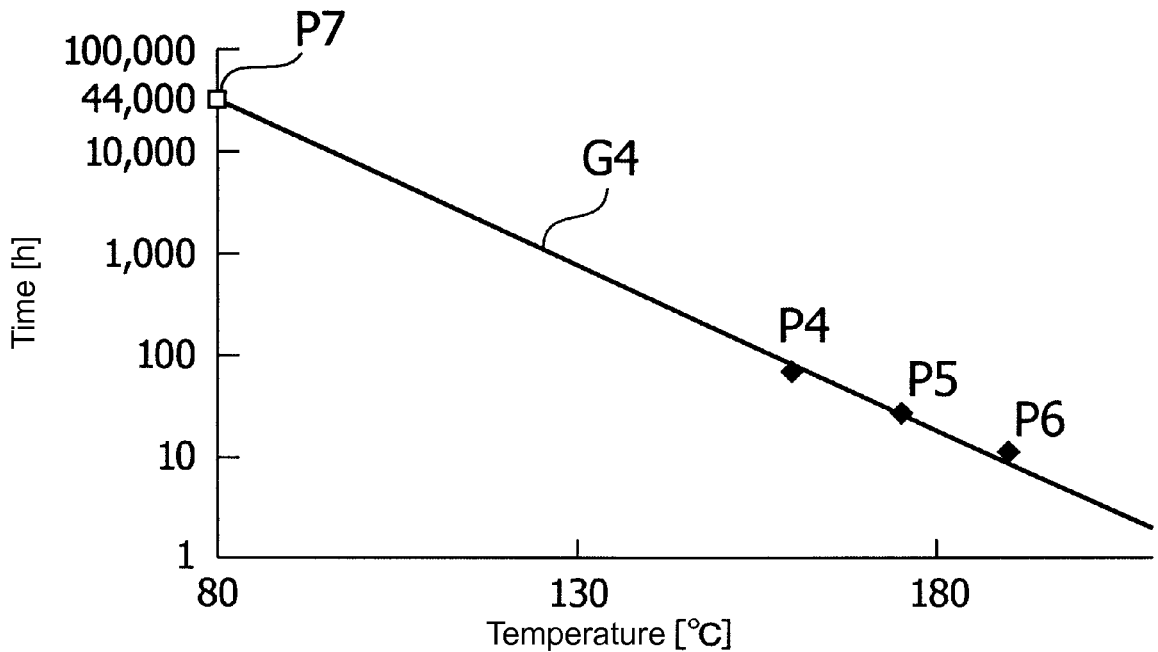
FIG. 3 is an explanatory diagram that illustrates a relationship between the temperature of the front surface of a sealing member of the semiconductor device and the operating time of the semiconductor device.

FIG. 3 illustrates the relationship between the temperature of the front surface 9b of the sealing member 9 and the operating time of the first semiconductor device for the value of b* to change from −33 to −15. Points P4 to P6 in FIG. 3 correspond to points P1 to P3 in FIG. 2, respectively. In other words, points P4 to P6 are points in accordance with measured values obtained from the heat degradation tests. Line G4 is approximated from these three points (P4 to P6). According to the approximated point P7 on the line G4, it is estimated that value of b* would be −15 after 44,000 hours if the second semiconductor device was continuously operated such that the temperature of the front surface 9b of the sealing member 9 of the second semiconductor device reached 80° C. This operating time of 44,000 hours can be considered to be the "life" of the sealing member 9. If the annual operating time is 2200 hours, then this operating time of 44,000 hours would be equivalent to 20 years.

The relationship (not shown) between the operating time and the value of b* can then be approximated, based on curves G1 to G3 in FIG. 2 and line G4 in FIG. 3, in a case in which the second semiconductor device 1 has been continuously operated such that the temperature of the front surface 9b of the sealing member 9 of the second semiconductor device 1 reached 80° C. The approximated relationship between the operating time and the value of b*, and the b* value of the front surface of the sealing member 9 at a certain time when the second semiconductor device is continuously operated so that the temperature of the front surface 9b of the sealing member 9 of the second semiconductor device reaches 80° C., are then compared. By so doing, the degradation state of the sealing member 9 of the second semiconductor device, or in other words, the operating time until that point and the remaining life of the second semiconductor device, can be estimated.

Figure 4:
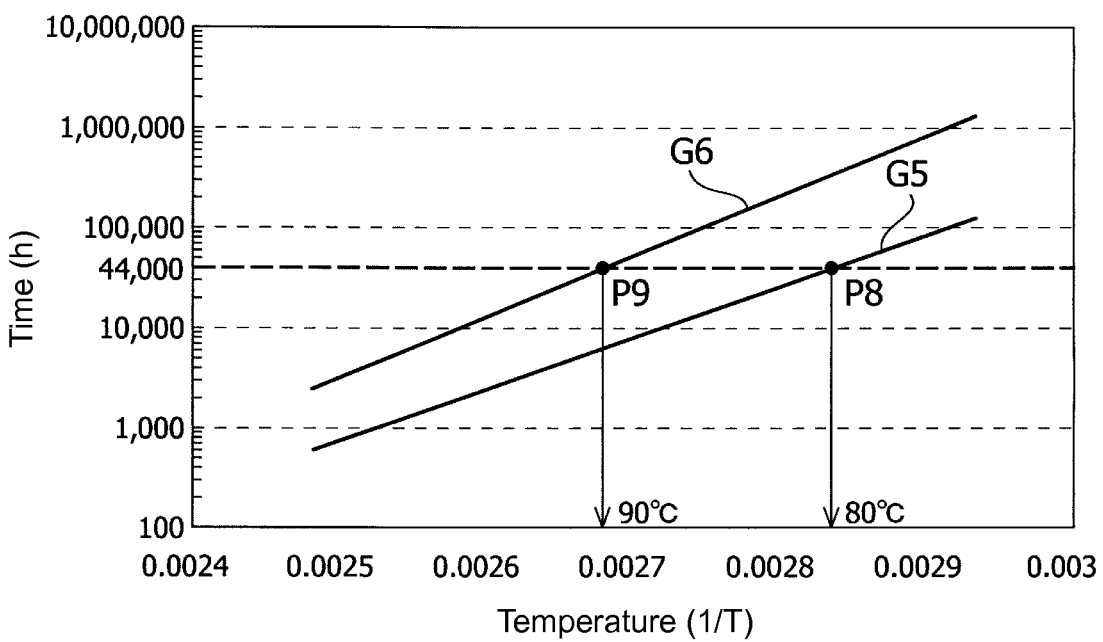
FIG. 4 is an explanatory diagram that illustrates the relationship between an inverse of the thermodynamic temperature of the front surface of the sealing member of the semiconductor device and the operating time of the semiconductor device.

Line G5 in FIG. 4 illustrates the relationship between an inverse of a thermodynamic temperature of the front surface 9b of the sealing member 9 and an operating time for the value of b* to change from an initial value of −33 to a value of −15. The point P8 on line G5 corresponds to point P7 in FIG. 3.

Example 2

A combination of two pigments (copper phthalocyanine, which is blue, and bismuth yellow, which is yellow) is used when forming the sealing member 9 of the first semiconductor device and the second semiconductor device. In such cases, the sealing member 9 will be green. A value of a* in the L*a*b* color space is used to quantify the green color. When looking at only negative values, the value of a* indicates that the green color becomes brighter as the value becomes smaller, and fades as the value approaches 0. The value of a* before heat degradation occurs is −30 to −15. The value of a* then increases to a value of −5 or higher as a result of degradation.

Line G6 in FIG. 4 illustrates the relationship between an inverse of a thermodynamic temperature of the front surface 9b of the sealing member 9 and an operating time for the value of a* to change from an initial value of −21 to a value of −10. From point P9 on line G6, it can be seen that the value of a* increases from the initial value of −21 to a value of −10 after 44,000 operating hours at a temperature of 90° C.

Additional Embodiments

Figure 5:
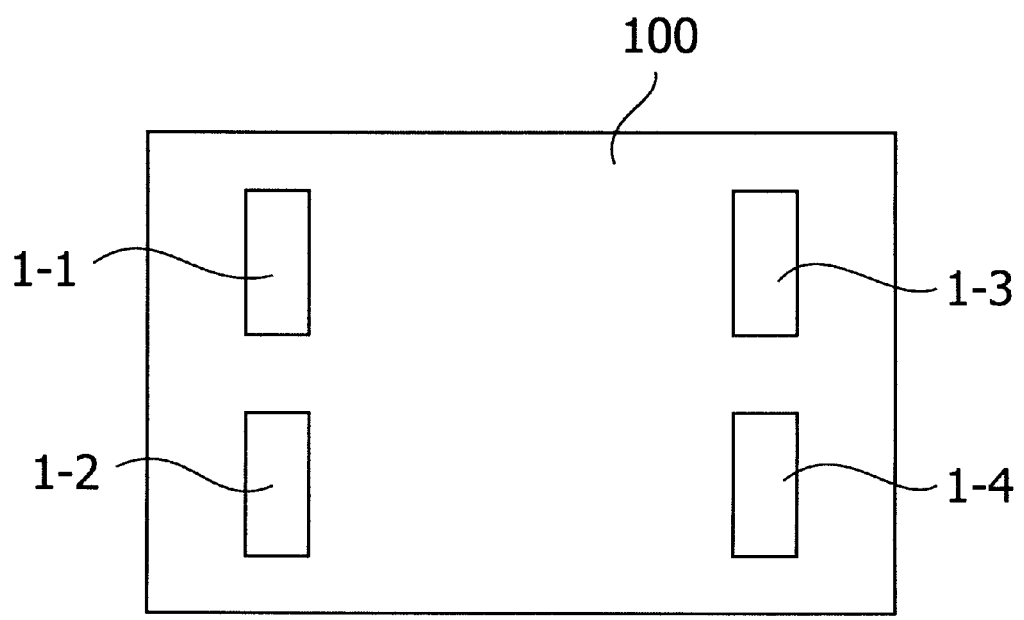
FIG. 5 is an explanatory diagram of another embodiment.

A plurality of semiconductor devices 1 can be mounted on an external printed circuit board disposed on the exterior of the plurality of semiconductor devices 1. As an example, FIG. 5 illustrates an external printed circuit board 100 on which four semiconductor devices 1 are mounted. To distinguish between the four semiconductor devices 1, each semiconductor device 1 has been given a reference character from 1-1 to 1-4. The degrees of discoloration of each of the sealing members 9 of the four semiconductor devices 1 are then compared to one another. As a result of this comparison, the load status of the four semiconductor devices 1 can be evaluated. In addition, if the discoloration of one of the semiconductor devices has progressed further than that of the other three semiconductor devices, it can be surmised that there is an abnormality in the one semiconductor device. The values in the previously mentioned L*a*b* color space, color samples, or the like can be used as standards for comparison in such cases. In addition, a determination may be made by a simple visual comparison when there is a clear difference in the discoloration among the plurality of semiconductor devices 1.

The heat degradation tests in the aforementioned Step 1 are not necessary when estimating the remaining life of a semiconductor device; obtaining a relationship among the three essential factors (temperature of the sealant, which is the material used to form the sealing member, duration, and color of the sealing member) is sufficient to perform such an estimation. In other words, the following steps may be used in place of Steps 1 to 3.

Step 1a: The sealant, which is the material used to form the sealing member, is heated and a relationship among the three essential factors (heating temperature, duration of heating, and color of the sealant) is obtained. In this relationship, the color of the sealant does not need to be represented by a numerical value, and may be represented by a visually verifiable color sample.

Step 2a: A semiconductor device that includes a sealing member formed from a sealant having the same composition as the aforementioned sealant is operated. The remaining life of the semiconductor device is estimated by comparing the color of the front surface of the sealing member at a certain time to the aforementioned relationship.

A different type of semiconductor element, such as a GaN (gallium nitride) semiconductor element, may be substituted for the SiC semiconductor element in FIG. 1. In addition, the primary component of the sealant forming the sealing member 9 is not limited to an epoxy resin, and a different resin such as a polyester resin can be used. An inorganic filler may be added, as needed, when making the sealant that forms the sealing member 9. Furthermore, the entire bottom surface of the first copper plating 22 may be sealed by the sealing member 9. Other methods besides a L*a*b* color space may be used when quantifying the color of the sealing member 9. These include a different type of color space, such as a RGB color space, or a color system.

Embodiments of the present invention were described above; however, the present invention is not limited to the above-mentioned embodiments and various modifications and changes in accordance with the technical spirit of the present invention are possible.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of determining a service life of a semiconductor device that includes a sealing member made of a sealant, the method comprising:
   heating a test sealant that has a same composition as a composition of the sealant in the semiconductor device at prescribed heating temperatures for prescribed durations;
   acquiring a relationship among the heating temperatures, heating durations, and resulting changes in color of the test sealant, by observing the color of the test sealant while the test sealant is being heated;
   determining a threshold color of a front surface of the sealing member in the semiconductor device in accordance with the relationship acquired in the step of acquiring said relationship; and
   determining that the semiconductor device has reached a service life and thereby terminating use of the semiconductor device when the color of the front surface of the sealing member in the semiconductor device has changed to the threshold color that is determined in the step of determining the threshold color.

2. The method according to claim 1, wherein the color of the test sealant is quantified using a L*a*b* color space in the step of acquiring said relationship, and the threshold color and the color of the front surface of the sealing member in the semiconductor device are quantified by an a* value or a b* value in the L*a*b* color space.

3. The method according to claim 1, wherein the step of heating includes:
   preparing a test semiconductor device having same structure and composition as structure and composition of the semiconductor device of which the remaining life is to be estimated;
   operating the test semiconductor device under a prescribed condition for a prescribed duration;
   measuring a temperature of the front surface of the sealing member of the test semiconductor device while the test semiconductor device is being operated; and
   observing changes in the color of the front surface of the sealing member of the test semiconductor device while the test semiconductor device is being operated.

4. A method of determining a service life of semiconductor devices, comprising:
   mounting a plurality of semiconductor devices, each including a sealing member formed of a sealant, on a substrate;
   comparing degrees of discoloration of the respective sealing members in the plurality of semiconductor devices to one another; and
   determining that the plurality of semiconductor devices have reaches a service life and thereby terminating use of the plurality of semiconductor devices when the step of comparing shows a prescribed degree of variation in the degrees of discoloration among the plurality of semiconductor devices.

5. The method according to claim 1, wherein the sealant is a blue sealant, the color of the test sealant is quantified using a L*a*b* color space in the step of acquiring said relationship, and the threshold color and the color of the front surface of the sealing member in the semiconductor device are quantified by a b* value in the L*a*b* color space.

6. The method according to claim 1, wherein the sealant is a green sealant, the color of the test sealant is quantified using a L*a*b* color space in the step of acquiring said relationship, and the threshold color and the color of the front surface of the sealing member in the semiconductor device are quantified by an a* value in the L*a*b* color space.

* * * * *